United States Patent [19]

Uematsu et al.

[11] 3,864,719

[45] Feb. 4, 1975

[54] SEMICONDUCTOR DEVICES HAVING NEGATIVE RESISTANCE AND STEPPED VOLTAGE-TO-CURRENT CHARACTERISTICS

[75] Inventors: Shigeyuki Uematsu; Haruhiko Abe, both of Amagasaki, Japan

[73] Assignee: Mitsubishi Denki Kabushiki Kaisha, Tokyo, Japan

[22] Filed: Oct. 5, 1973

[21] Appl. No.: 403,781

Related U.S. Application Data

[63] Continuation of Ser. No. 269,241, July 5, 1972, abandoned.

[30] Foreign Application Priority Data

July 7, 1971 Japan ............ 46-50042
July 9, 1971 Japan ............ 46-50786

[52] U.S. Cl. ............ 357/4, 357/6, 357/57, 357/90

[51] Int. Cl. ............ H01l 11/00, H01l 15/00

[58] Field of Search ............ 317/234, 8, 8.1, 235, 25, 317/25.1, 48.2

[56] References Cited

UNITED STATES PATENTS

| | | | |
|---|---|---|---|
| 3,121,808 | 2/1964 | Kahng et al. | 317/235 K |
| 3,331,998 | 7/1967 | Zuleeg | 317/234 T |
| 3,390,311 | 6/1968 | Aven et al. | 317/235 AL |
| 3,588,637 | 6/1971 | Jaklevic | 317/235 K |

FOREIGN PATENTS OR APPLICATIONS

| | | | |
|---|---|---|---|
| 1,136,820 | 12/1968 | Great Britain | 317/235 K |

*Primary Examiner*—Andrew J. James
*Attorney, Agent, or Firm*—Robert E. Burns; Emmanuel J. Lobato; Bruce L. Adams

[57] ABSTRACT

Nitride of a valve metal such as molybdenum in the form of a thin film is disposed on a substrate of p or n silicon and they are sandwiched between two electrode layers. In accordance with the impurity concentration of the silicon, the resulting device as negatively biased exhibits a V - I characteristic stepped or including a current controlled negative resistance(s). In an atmosphere of highly pure nitrogen under a very low pressure molybdenum atoms are moved across a plasma column to be converted into molybdenum nitride which is, in turn, deposited upon the substrate.

6 Claims, 7 Drawing Figures

SEMICONDUCTOR DEVICES HAVING NEGATIVE RESISTANCE AND STEPPED VOLTAGE-TO-CURRENT CHARACTERISTICS

This is a continuation, of application Ser. No. 269,241, filed July 5, 1972, now abandoned.

BACKGROUND OF THE INVENTION

This invention relates to semiconductor devices having special voltage-to-current characteristics in the reversely biased direction and a process of producing the same.

It is well known that substrates of semiconductive material such as silicon, germanium or the like having the layer of metallic material attached thereto can have the voltage-to-current characteristic including a rectifying portion. Such rectifying characteristic may be also observed in semiconductor p-n junction diodes. With the p-n junction reversely biased, a current flowing therethrough can suddenly increase for the applied voltage increased in absolute value above the breakdown voltage $V_B$(or $|V| > |V_B|$). In that region in which the current suddenly increases, the voltage-to-current characteristic may be in the form of steps. That is to say, when the biasing voltage reversely applied across the p-n junction reaches a certain magnitude, the resulting current may be suddenly and stepwise transferred from the low to the high conduction state. When so transferred, the p-n junction may exhibit a negative resistance characteristic. Alternatively, it may not exhibit such a characteristic.

The phenomenon just described is considered to be caused from the so-called "microplasma" characterized in that it is accompanied by the emission of visible light and/or the formation of a pulsed current. The microplasma is caused from the breakdown occurring at electrically weak points discretely localized at the p-n junction due to a lack of uniformity of the surface at the p-n junction. In order to stably provide the stepped voltage-to-current characteristic or the stepped characteristic with a negative resistance region or regions attendant upon the microplasma with good reproducibleness, it is required to control the non-uniformity of the surface at the p-n junction per se. It is extremely difficult to locally form the controlled weak points on the surface of the p-n junction through the use of the existing thermal diffusion technique. Thus it is a task of extreme difficulty that semiconductor diodes having the characteristics as above described are stably produced according to those manufacturing processes presently practiced while the reproducibleness is kept high. Further, it is almost impossible to provide semiconductor diodes having the stepped characteristic including parameters such as spacings between the steps values negative resistance etc. controllable at will.

SUMMARY OF THE INVENTION

Accordingly it is an object of the invention to provide a new and improved semiconductor device having a reverse voltage-to-current characteristic with at least one negative resistance region and stably produced with high reproducibility.

It is another object of the invention to provide a new and improved current controlled negative resistance element including at least one negative resistance region in the reversely biased direction.

It is still another object of the invention to provide a new and improved process of producing semiconductor devices having a stepped characteristic or a current controlled negative resistance characteristics in the reversely biased region.

It is a further object of the invention to provide a new and improved semiconductor device having a stepped characteristic or a current controlled negative resistance characteristic in the reversely biased region whose parameters such as spacing between the steps, the breakdown voltage and negative resistance are controllable at will and a process of producing the same.

The invention accomplishes the above cited objects by the provision of a semiconductor device comprising a substrate of semiconductive material having one type conductivity and including a pair of main opposite faces, a layer of semiinsulating material comprising a thin film formed of nitride of a valve metal being about 100A. to 10,000 A. thick and disposed on one of the main faces of the substrate, and one metallic electrode layer disposed on each of the exposed face of the nitride film and the other main face of the substrate whereby the device has a negative resistance region when negatively biased in operation.

In order to provide the stepped voltage-to-current characteristic in the reversely biased region, the semiconductive material for the substrate may have an impurity concentration of from $10^{14}$ to $10^{16}$ atoms per cubic centimeter.

Alternatively, in order to provide the current controlled negative resistance characteristic in the reversely biased region, the semiconductive material for the substrate may have an impurity concentration of from $10^{13}$ to $10^{14}$ atoms per cubic centimeter.

The value metal may be advantageously selected from the group consisting of molybdenum, tantalum, tungsten, titanium, aluminum and niobium.

A process of producing the semiconductor devices as above described comprises the steps of disposing a substrate of semiconductive material having a predetermined impurity concentration and a body of valve metal in opposite relationship within a vacuum envelope, evacuating the envelope, introducing nitrogen gas under a controlled pressure into the evacuated envelope, establishing a plasma column in a space formed between the substrate and the body of valve metals, and applying negative potential to body of valve metal thereby to move atoms from the body of valve metal across the plasma column to convert them into the corresponding nitride and deposite the nitride on the substrate.

BRIEF DESCRIPTION OF THE DRAWINGS

The invention will become more readily apparent from the following detailed description taken in conjunction with the accompanying drawings in which.

DESCRIPTION OF THE PREFERRED EMBODIMENTS

Figure 1:
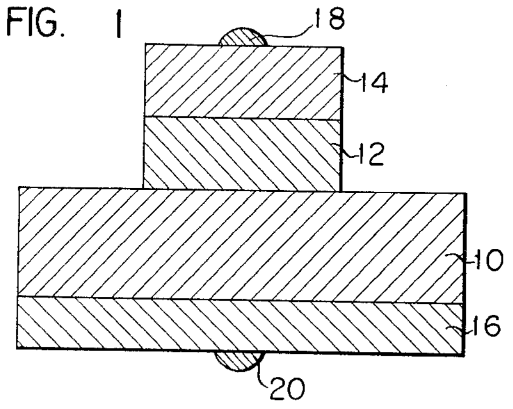
FIG. 1 is a longitudinal sectional view in enlarged scale of a semiconductor device constructed in accordance with the principles of the invention.

Referring now to FIG. 1 of the drawings it is seen that an arrangement disclosed herein comprises a substrate 10 of any suitable semiconductive material, a thin film 12 of nitride of a suitable valve metal disposed on one of the main opposite faces of the substrate 10, a metallic electrode layer 14 disposed upon the nitride film 12 and another metallic electrode layer 16 disposed on the other main face of the substrate 10. Then electrode terminals 18 and 20 are evaporated upon the electrode layers 14 and 16 respectively.

The substrate 10 may be formed of silicon or germanium of either p or n type conductivity. The film 12 is formed of nitride of a metal selected from the group consisting of molybdenum, tantalum, tungsten, titanium, aluminum and niobium. Among them molybdenum and tantalum are preferred examples of the valve metal. The nitride film 12 deposited on the substrate 10 by spattering process is effected in a plasma column as will be described hereinafter. The electrode layers 14 and 16 may be of any of the well known electrically conductive materials such as aluminum, gold, silver, copper, nickel etc.

It is to be noted that the material for the substrate 10 should have an impurity concentration of either about $10^{14}$ to about $10^{16}$ atoms per cubic centimeter or of about $10^{13}$ to about $10^{14}$ atoms per cubic centimeter as will be described hereinafter and that the nitride film 12 must have a thickness of from 100 to 10,000A.

Figure 2:
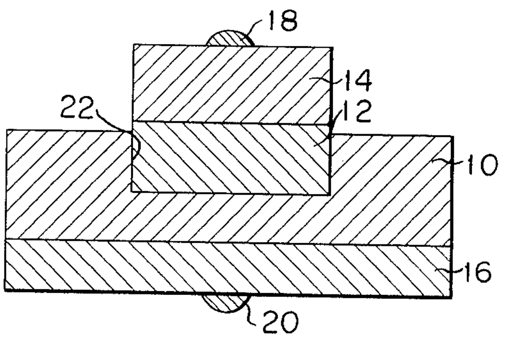
FIG. 2 is a view similar to FIG. 1 but illustrating a modification of the invention.

FIG. 2 shows an arrangement similar to that illustrated in FIG. 1 expecting that in FIG. 2, means defining a recess 22 is centrally formed on the main face of the substrate 10 and has the nitride film 12 disposed therein to slightly project beyond the substrate's face. Therefore like reference numerals have been employed to identify the components identical or corresponding to those shown in FIG. 1.

In the arrangement of FIG. 2 it will be appreciated that, as compared with that shown in FIG. 1, that area with which the nitride film 12 contacts the substrate 10 is increased while the upper electrode layer 14 utilized for the required surface wiring is low in its level relative to the substrate's face. Thus the surface wiring is facilitated and there is little opportunity of causing faults such as disconnection. Accordingly the arrangement of FIG. 2 is suitable for use in integrated circuits. Further it is high in reliability.

Figure 3:
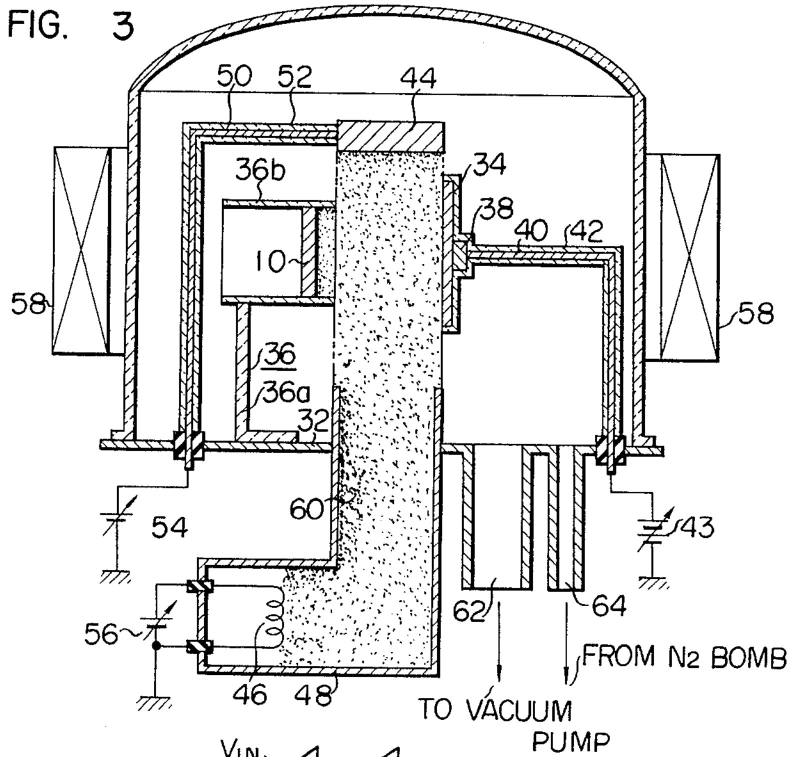
FIG. 3 is a schematic longitudinal view of an apparatus for producing semiconductor devices in accordance with the principles of the invention.

Referring now to FIG. 3, there is illustrated an apparatus for producing semiconductor devices such as shown in FIGS. 1 and 2. The apparatus illustrated comprises a vacuum glass envelope 30 in the form of a bell jar disposed in vacuum tight relationship upon a bottom plate 32 formed of any suitable metallic material such as stainless steel. Within the envelope 30 there are disposed a semiconductive substrate 10 such as above described bed in conjunction with FIG. 1 and a body of valve metal such as molybdenum in the form of a plate 34 in opposite relationship to leave a central space therebetween for the purpose as will be apparent later. More specifically, a support structure generally designated by the reference numeral 36 includes an upright leg portion **36*a* fixedly secured to the bottom plate 32 and a hollow cylindrical portion 36*b* horizontally secured to the free end of the leg portion 36*a*. The substrate 10 is fitted into the hollow cylindrical portion 36*b* just short of the inner end or that end near to the metallic plate 34. The support structure 36 is preferably formed of quartz. The metallic plate 34 opposing to the one of the main faces of the substrate 10 is fixed to a support member 38 as by welding. The support member 38 is preferably of stainless steel and carried by and electrically connected to a bent, an electric conductor 40 sealed in electrically insulating relationship through the metallic bottom plate 32. Then the conductor 40 is connected to a negative terminal of a source 42 of dc potential disposed externally of the envelope 30 with the positive terminal thereof grounded. That portion of the conductor 40 disposed in the form of an inverted L within the envelope 30 is enclosed with a glass sleeve 42, and the metallic plate 34 along with the support member 36 has the exposed surface covered with a layer of powdered metal or glass layer as shown in FIG. 3 except for that surface of the plate 34 opposite to the substrate 10. The support member 36 and therefore the metallic plate 34** is adapted to be rotatable about the axis of the vertical conductor portion.

In order to establish a plasma column in the space formed between the substrate and metallic plate 10 and 34 respectively, an anode electrode 44 is disposed above those two components within the envelope 30 to define one end of the space while a hot cathode electrode 46 in the form of a coil disposed adjacent a closed end of a metallic tube 48 having an open end portion extending into the envelope 30 to oppose to the anode electrode 44. The anode electrode 44 is electrically connected to and carried by an inverted L-shaped conductor 50 with a glass sleeve 52 sealed in electrically insulating relationship through the bottom plate 36 and thence to a source 54 of dc voltage at the positive terminal. The source 54 has a negative terminal grounded. The cathode electrode 46 is adapted to be heated by a source 56 of voltage. The sources 54 and 56 are also disposed externally of the envelope 30.

As shown in FIG. 3, an air core winding 58 surrounds the envelope 30 for the purpose of collecting a plasma column (which is designated by the reference numeral 60) produced between the anode and cathode electrodes 44 and 46 respectively in that a predetermined space confined by the substrate 10, the molybdenum plate 34, the anode electrode 44 and the tube 48.

The bottom plate 38 for the envelope 30, is shown in FIG. 3 as being provided with an evacuating port 62 serving to evacuate the envelope 30 and also with an introduction port 64 serving to introduce nitrogen gas into the envelope 30. Then the port 62 is adapted to be connected to diffusion pump and then to a rotary vacuum pump and the port 64 is adapted to be connected to a nitrogen reservoir such as a nitrogen bomb although the pump and bomb are not illustrated.

The process according to the invention will now be described in conjunction with FIG. 3 on the assumption that silicon, molybdenum and aluminum are used as the materials for the substrate 10, the metallic film 12 and electrode layers 14 and 16 respectively. First any suitable conductivity imparting impurity is used to prepare a substrate of p or n type silicon having a predetermined impurity concentration. The substrate thus prepared is subject to a well known cleaning process utilizing hot sulfuric acid, hot nitric acid and hydrofluoric acid to remove foreign matters adhering to and a thin layer of silicon dioxide formed on the surface thereof. After the surface has been thus cleaned, the substrate is immediately fitted into the horizontal hollow cylindrical portion 36*b* to be put slightly inside of the open end thereof with the envelope 30 removed from the bottom plate 32 and with the support member 38 with the sleeved conductor 40 turned toward the observer's side or the opposite side about the axis of the vertical conductor portion. Then a molybdenum plate such as the plate 34 is fixed to the support member 38 as by welding after which the resulting assembly is returned back to its original position where the molybdenum plate diametrically opposes to the substrate 10.

Now the envelope 30 is disposed in vacuum tight relationship upon the bottom plate 32 and vacuum means (not shown) is operated to evacuate the interior of the envelope 30 through the evacuating port 62. When a pressure in the envelope 30 reaches a predetermined value for example $1 \times 10^{-7}$ torr, highly pure nitrogen gas is introduced into the envelope 30 through the introducing port 64. While the vacuum means is continuously operated, the pressue of the nitrogen gas within the envelope 30 is maintained at about $10^{-2}$ torr by adjusting the flow rate of the nitrogen gas.

Under these circumstances, the source 56 supplies a predetermined current to the cathode electrode 46 to permit the surface of the hot electrode 46 to emit electrons causing effectively the thermal radiation. Thereafter the source 43 applies a dc voltage of about 60 volts across the anode and hot cathode electrodes 44 and 46 respectively to establish a plasma column 60 between both electrodes. At that time, a current of approximately 10 amperes is caused to flow through the winding 58 to establish a magnetic field thereby to collect the plasma column 60 in a space confined by the substrate and molybdenum plate 10 and 34 respectively. The plasma column 60 could have a diameter of about 5 cm.

That main face of the substrate 10 opposite to the molybdenum plate 34 is exposed to the plasma column 60 for a time interval of from 2 to 5 minutes to liberate gases adsorbed on the surface thereof. Then the source 43 applies a negative potential to the molybdenum plates 34 through the sleeved conductor 44 and the support member 38 for a time interval of from about 3 to 5 minutes. The negative potential is preferably of a value ranging from about −500 to −1,000 volts with respect to ground. This causes molybdenum atoms to rush out of the surface of the molybdenum plate 34 through the collision with high energy ions. During the movement across the plasma column 60, the molybdenum atoms are combined with the nitrogen to form the corresponding nitride. The nitride strikes against and adheres to the exposed surface of the substrate 10. When the nitride film adhering to the substrate 10 has a predetermined thickness of about 100 to 10,000A., the application of the nitride film to the substrate is completed.

An adhering rate could be of about 50A./min. For this value of the adhering rate, the nitride film reached its predetermined thickness for a time interval ranging from about 2 to 20 minutes.

Then in order to dispose an electrode layer upon the nitride film thus formed, aluminum is vacuum-evaporated, for example, to a thickness of several thousands angstrom units upon the nitride film according to a vacuum evaporation technique utilizing the resistance heating which is well known in the art. Thereafter a conventional photolithographic process employing any desired photosensitive resin is used to leave the nitride film and electrode into the desired shapes upon a predetermined area of the substrate's face as shown in FIG. 1. Similarly an aluminum layer such as the electrode layer 16 shown in FIG. 1 is disposed on the other main face of the substrate and electrode terminals are attached to both aluminum layers in the well known manner to complete a device such as shown in FIG. 1.

If it is desired to produce a semiconductor device such as shown in FIG. 2 then a substrate such as above described will be provided on one of the main opposite faces thereof with a recess such as shown by the reference numeral 22 in FIG. 2. Then the process as above described is repeated.

Figures 4, 5, 6:
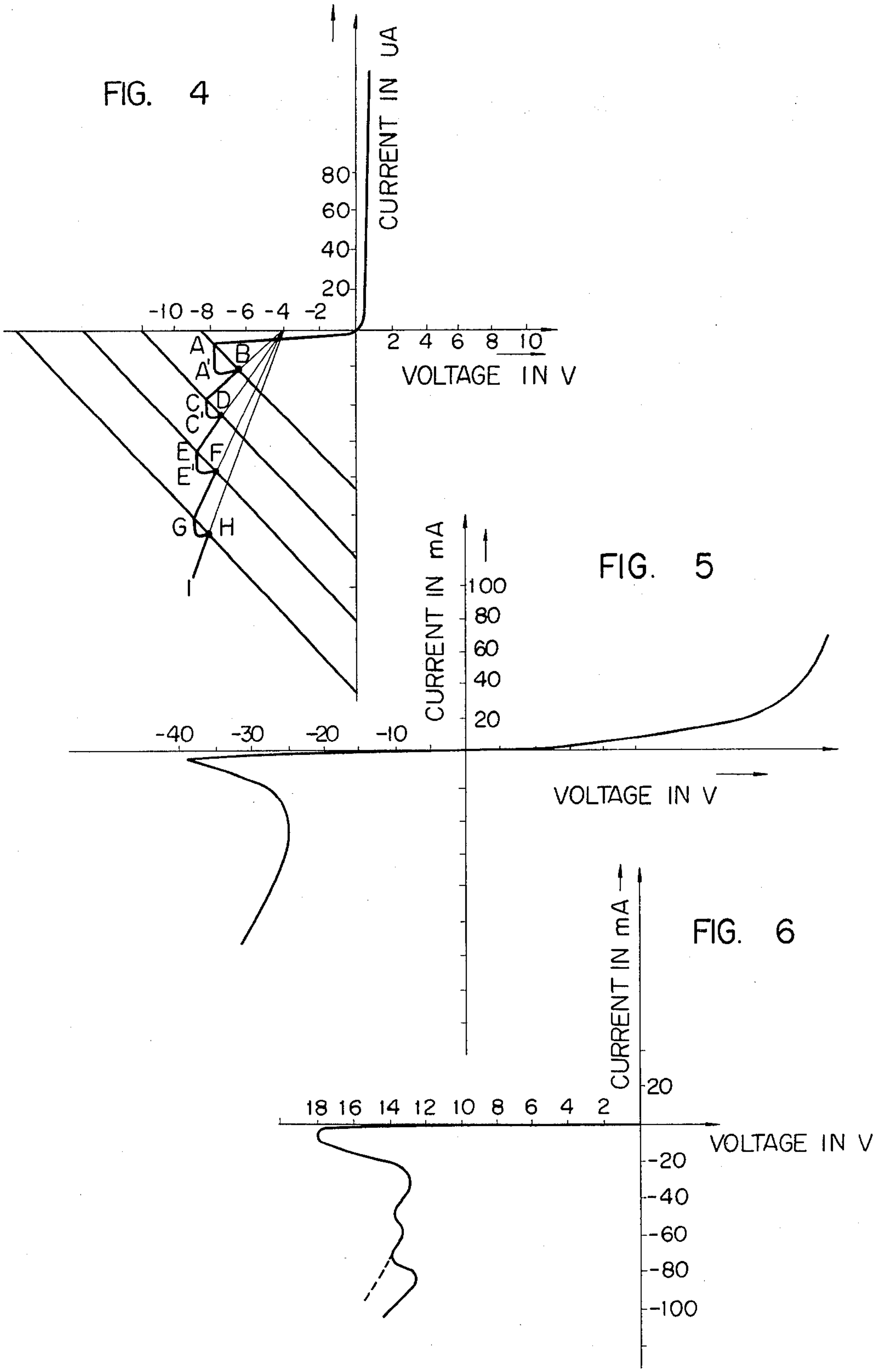
FIG. 4 is a graph illustrating one form of the voltage-to-current characteristic exhibited by a semiconductor device constructed in accordance with the principles of the invention.
FIGS. 5 and 6 are views similar to FIG. 4 but illustrating different forms of the voltage-to-current characteristic.

Nitrogen oxide-silicon diodes produced in accordance with the present process as above described can typically have a voltage-to-current characteristic as shown in FIGS. 4, 5 or 6 wherein a current flowing through the diode is plotted in ordinate against a voltage applied across the diode in abscissa.

FIG. 4 shows by way of example a voltage-to-current characteristic exhibited by the diode having an impurity concentration of from $10^{14}$ to $10^{16}$ atoms per cubic centimeter by doping it with an n type conductivity imparting impurity such as phosphorous, arsenic, or antimony. As seen in FIG. 4, the voltage-to-current characteristic includes a stepped portion on the third quadrant of its curve or in the negatively biased region. More specifically, in response to an applied voltage reaching minus 8 volts, a current is abruptly transferred from point A to point B through point A' to form a stepped portion of the voltage-to-current characteristic. As the applied voltage negatively increases, similar stepped portions appear as shown at CC'D, EE', F and GG'H.

It is noted that that portion of the transfer path extending from point A to point A' is a negative resistance region. The results of experiments indicate that the negative resistance region AA' becomes long by decreasing the operating temperature of the substrate but short by irradiating the substrate with light radiation. Also it has been found that a slope of a line passing through points A and B or a resistance is controllable by means of a loss resistance serially connected to the diode. Further it is possible to control the breakdown voltage $V_B$ of the diode by means of the operating temperature or impurity concentration of the subsrate or through the irradiation with laser light. These are true in the case of the transfers stepped portions CC'D, EE'F etc.

FIGS. 5 and 6 show voltage-to-current characteristics exhibited by the diode as above described in conjunction with FIG. 4 having an impurity concentration of from $10^{13}$ to $10^{14}$ atoms per cubic centimeter. FIG. 5 shows a voltage-to-current characteristic of backward type including a current controlled negative resistance portion on the third quadrant of its curve or in the negatively biased region. FIG. 6 shows a voltage-to-current characteristic similar to that illustrated in FIG. 5 but including three or two negative resistance portions controlled with the current.

It is known that point contact diodes of the conventional construction may exhibit the voltage-to-current characteristic in the negatively biased region or on the third quadrant of its curve similar to the corresponding portion shown in FIGS. 5 or 6. For such diodes, the forward current become very high in value as compared with the reverse current whereby the backward type characteristic is not exhibited.

Also the backward type characteristic may be exhibited by p-n junction diodes produced according to conventional thermal diffusion processes. For such diodes, however, their voltage-to-current characteristics do not include the negative resistance portion in the negatively biased region.

In contrast, the invention easily provides backward diodes exhibiting the voltage-to-current characteristic including a negative resistance portion or portions in the negatively biased region or on the third quadrant of the curve. It is believed that silicon nitride formed at the interface of silicon and molybdenum nitride will contribute to the abovementioned characteristics being stably obtained with a high reproducibleness.

It is noted that the stepped characteristic as shown in FIG. 4 and the current controlled negative resistance characteristic as shown in FIGS. 5 or 6 can be observed in semiconductor diodes having either of the hard and soft breakdown characteristics.

Figure 7:
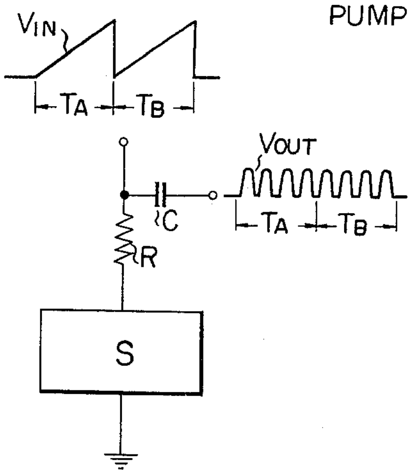
FIG. 7 is a schematic circuit diagram of a frequency multiplier to which the invention is applied with an input and an output waveform illustrated beside the input and output terminals respectively.

FIG. 7 shows one form of the invention applied to a frequency multiplier. In FIG. 7, the reference character "S" designates a semiconductor device having the stepped characteristic as shown in FIG. 4. The diode S is connected at one of the electrode terminals to an input terminal $V_{in}$ through a resistor R and at the other electrode terminal to ground. The junction of the resistor and input terminal R and $V_{in}$ respectively is connected to an output terminal $V_{out}$ through a capacitor C forming a differentiation network with the resistor R.

If a triangular waveform $V_{in}$ linearly increased in amplitude and having a duration of $T_A$ is applied to the input terminal $V_{in}$ then a train of four pulses $V_{out}$ is produced at the output terminal $V_{out}$ for a time period equal to the duration $T_A$ because the diode exhibits the characteristic including four steps as shown in FIG. 4. The succeeding waveform similar to the first waveform is applied to the input terminal $V_{in}$ to produce four pulses at the output terminal $V_{out}$ during its duration of $T_B$. Thus when the input waveform $V_{in}$ is repeatedly applied to the input terminal $V_{in}$, the output terminal $V_{out}$ produces output pulses whose number is proportional to the number of the input waveforms repeated resulting in the frequency multiplication.

Accordingly it will readily be understood by those skilled in the art that the invention is not only applicable to negative resistance elements but also can be equally applied to a variety of the fields of frequency multipliers, counters for counting numbers having their radix of any desired integer N, frequency dividers etc. by properly selecting the number of steps appearing in the third quadrant of the voltage-to-current curve.

What we claim is:

1. A semiconductor device receptive in operation of a reverse bias potential thereacross comprising means developing in operation a stepped voltage-to-current characteristics wherein said means developing said stepped voltage-to-current characteristic comprises, a substrate of semiconductive material selected from a group consisting of silicon and germanium having an impurity concentration from about $10^{14}$ to $10^{16}$ atoms per cubic centimeter and having a pair of opposite major surfaces, a thin film of a nitride of a valve metal selected from a group consisting of molybdenum, tantalum, tungsten, titanium, and niobium disposed on a major surface of said substrate and being from about 100 to 10,000 A. thick, a first electrode comprising a layer of conductive material disposed on a major surface of said substrate opposite said major surface bearing said thin film, and a second electrode comprising a layer of conductive material disposed on said thin film.

2. In a semiconductor device according to claim 1 wherein said substrate of semiconductive material is provided with a recess on said major surface of said substrate on which said thin film of a nitride of a valve metal is disposed to increase an area of contact between said major surface of said substrate and said thin film.

3. A semiconductor device receptive in operation of a reverse bias potential thereacross comprising means developing in operation a negative resistance characteristic wherein said means developing said negative resistance characteristic comprises, a substrate of semiconductive material selected from a group consisting of silicon and germanium having an impurity concentration from about $10^{13}$ to $10^{14}$ atoms per cubic centimeter and having a pair of opposite major surfaces, a thin film of a nitride of a valve metal selected from a group consisting of molybdenum, tantalum, tungsten, titanium, and niobium disposed on a major surface of said substrate and being from about 100 to 10,000A. thick, a first electrode comprising a layer of conductive material disposed on a major surface of said substrate opposite said major surface bearing said thin film, and a second electrode comprising a layer of conductive material disposed on said thin film.

4. In a semiconductor device according to claim 3, wherein said substrate of semiconductive material is provided with a recess in said major surface of said substrate on which said thin film of a nitride of a valve metal is disposed to increase an area of contact between said major surface of said substrate and said thin film.

5. A semiconductor device receptive in operation of a reverse bias potential thereacross comprising, means developing in operation a stepped voltage-to-current characteristic wherein said means developing said stepped voltage-to-current characteristic comprises, a substrate of silicon having an impurity concentration from about $10^{14}$ to $10^{16}$ atoms per cubic centimeter and having a pair of opposite major surfaces, a thin film of molybdenum nitride disposed on a major surface of said substrate and being from about 100 to 10,000A. thick, a first electrode comprising a layer of conductive material disposed on a major surface of said substrate opposite said major surface bearing said thin film of molybdenum nitride, and a second electrode comprising a layer of conductive material disposed on said thin film.

6. A semiconductor device receptive in operation of a reverse bias potential thereacross comprising, means developing in operation a negative resistance characteristic wherein said means developing said negative reistance characteristic comprises a substrate of silicon having an impurity concentration from about $10^{13}$ to $10^{14}$ atoms per cubic centimeter and having a pair of opposite major surfaces, a thin film of molybdenum nitride disposed on a major surface of said substrate and being from about 100 to 10,000A. thick, a first elecrode comprising a layer of conductive material disposed on a major surface of said substrate opposite said major surface bearing said thin film of molybdenum nitride, and a second electrode comprising a layer of conductive material disposed on said thin film.

* * * * *